United States Patent [19]
Lin

[11] Patent Number: 5,386,207
[45] Date of Patent: Jan. 31, 1995

[54] COMPARATOR WITH APPLICATION IN DATA COMMUNICATION

[75] Inventor: San L. Lin, San Jose, Calif.

[73] Assignee: Winbond Electronics North America Corporation, San Jose, Calif.

[21] Appl. No.: 902,632

[22] Filed: Jun. 23, 1992

[51] Int. Cl.$^6$ .............................................. G06F 7/02
[52] U.S. Cl. .................... 340/146.2; 330/258; 330/259; 327/67; 327/65; 327/513; 327/545
[58] Field of Search ............... 307/359, 358, 490, 491, 307/296.4, 355; 330/258, 259; 340/146.2

[56] References Cited

U.S. PATENT DOCUMENTS

| | | | |
|---|---|---|---|
| 4,105,942 | 8/1978 | Henry | 330/258 |
| 5,008,632 | 4/1991 | Sutterlin | 330/258 |
| 5,077,496 | 12/1991 | Wolczanski | 307/296.4 |
| 5,187,448 | 2/1993 | Brooks et al. | 330/258 |

FOREIGN PATENT DOCUMENTS 0086908  4/1987  Japan ..................... 330/259

Primary Examiner—Margaret Rose Wambach
Attorney, Agent, or Firm—Skjerven, Morrill, MacPherson, Franklin & Friel

[57] ABSTRACT

A comparator that may be used in data communications transmission lines, in particular, an Ethernet Twisted-Pair line. The comparator accepts as input the differential voltage from the transmission lines. The comparator uses feedback circuitry to monitor particular voltages within the comparator and adjust them as necessary to mitigate the effect of bias offset within the comparator that may result from, for instance, temperature driven device parameter variations. The comparator also minimizes the effect of power supply noise. The feedback circuitry ensures that as the comparator input differential voltage approaches zero (i.e., when the comparator outputs should switch from a high voltage to a low voltage or vice versa), the input of a comparator output amplifier is situated in the middle of the high gain region of the output amplifier, ready to quickly trigger switching of the comparator output when the comparator input differential voltage crosses zero volts. In one embodiment, the feedback circuitry comprises an operational amplifier and two resistive-capacitive structures.

27 Claims, 7 Drawing Sheets

COMPARATOR WITH APPLICATION IN DATA COMMUNICATION

BACKGROUND OF THE INVENTION

1. Field of the Invention

This invention relates to data communications comparators and, in particular, to integrated circuit data communications receivers of the comparator type.

2. Description of Related Art

Integrated circuit receivers enjoy widespread use in data communications. For example, in an Ethernet system, data signals are differential signals transmitted over a twisted pair. The data signals are generally of a sine wave character. The data signals are shaped in a receiver, which typically is a type of comparator.

An example of a comparator for receiving Ethernet signals is shown in FIG. 1. Input signals enter the comparator 10 at nodes 11 and 12. The input signals are amplified and buffered by the network consisting of transistors 51, 52, 55, 56, 61, 62, 63, and resistors 53, 54. The amplified and buffered signals at nodes 15 and 16 are then amplified by inverting amplifiers 81, 83 and 82 84, respectively, to yield the output signals from the comparator 10 at nodes 19 and 20.

One problem encountered with the use of comparators to shape transmitted signals is that an unpredictable bias offset (which is the deviation of bias levels from their ideal values) can arise in the comparator so that the relative transitions between logic levels at the comparator output are distorted. Types of distortion typically encountered include, for example, phase distortion and duty cycle distortion. In phase distortion, the rising and falling edge of the comparator output waveform jitters or appears faster or slower than would be expected. In duty cycle distortion, the duty cycle of the comparator output differs from the duty cycle of the transmitted data signal at the comparator input. The bias offset results from, for instance, fluctuation in circuit parameters due to process and temperature changes and power supply noise.

In the comparator 10 shown in FIG. 1, bias generation circuitry consisting of differential amplifier 70, inverting amplifier 74, transistors 71, 72, 75 and resistor 73 is provided to overcome the problem of bias offset. The bias generation circuitry generates a current through the transistor 75 which, in turn, is mirrored in the transistors 61, 62 and 63. The components in the bias generation circuitry are matched With other components in the comparator 10 so that an appropriate amount of current will flow through the transistors 61, 62, 63 to keep the inverting amplifiers 81 and 82 biased in their high gain region when the inputs at nodes 11 and 12 are equal.

This circuit is inadequate for some applications because mismatch of currents in the transistors 75, 61, 62 and 63, or mismatch of device values between transistors 71, 55, 56 or resistors 73, 53, 54 will prevent the inverting amplifiers 81 and 82 from being properly biased. This circuit is also inadequate because it does not act to minimize the detrimental effects arising from the presence of noise in the power supply.

It is desirable, then, to provide a comparator in which fluctuations in the bias offset and the effects of power supply noise are minimized.

SUMMARY OF THE INVENTION

In accordance with the invention, a comparator is provided that may be used in data communications. In particular, the comparator may be advantageously used with an Ethernet Twisted-Pair line.

The comparator accepts as input a differential voltage from the transmission lines. The input differential voltage is amplified and buffered in a low gain first stage. The comparator further uses feedback circuitry to ensure that switching of the comparator output voltage between logic highs and lows accurately tracks the switching of the comparator input differential voltage between positive and negative. The feedback circuitry mitigates bias offset within the comparator that may result from, for instance, temperature driven device parameter variations.

In one embodiment, the feedback circuitry comprises an operational amplifier and a resistive-capacitive network. The resistive-capacitive network averages the output voltages of the low gain first stage to obtain a common-mode voltage. The common-mode voltage and a reference voltage equal to the logic threshold of an output amplifier constitute the two inputs to the operational amplifier. If the common-mode voltage is different from the reference voltage, then the output of the operational amplifier controls current in the low gain first stage so as to change the output DC level of the low gain first stage (i.e., input DC level of the output amplifier). The output DC levels of the low gain first stage are changed until the common-mode voltage (i.e., average of the two first stage output voltages) equals the reference voltage (i.e., logic threshold of the output amplifier).

The feedback circuitry thus ensures that as the comparator input differential voltage approaches zero (i.e., when the comparator outputs should switch from a logic high voltage to a logic low voltage or vice versa), the input of the output amplifier is situated in the middle of the high gain region of the output amplifier. In other words, the feedback circuitry ensures that the output amplifier is ready to quickly trigger switching of the comparator output when the comparator input differential voltage crosses zero volts.

Additionally, the feedback circuitry compensates for the effects of noise in the power supply. When noise appears in the comparator at the output voltages of the first stage, the feedback circuitry controls currents in the first stage so that the output voltages of the first stage are changed until the noise is eliminated.

In another embodiment, the resistive-capacitive network is implemented in silicon using a diffused region for the resistance and a polysilicon plate for the capacitance. This implementation provides an area efficient way of generating the common-mode voltage in an integrated circuit.

DETAILED DESCRIPTION OF THE PREFERRED EMBODIMENTS

Figure 1:
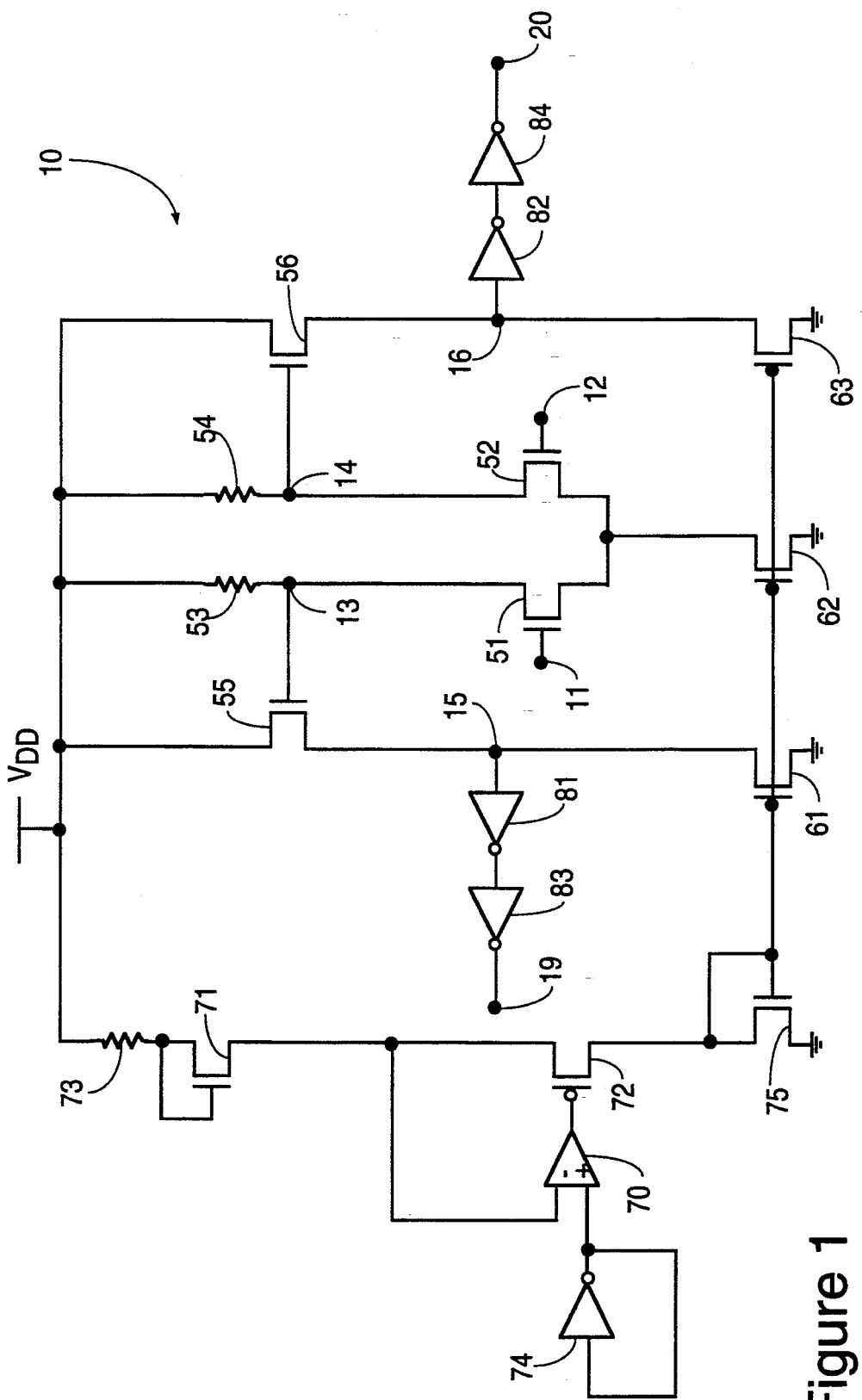
FIG. 1 is a circuit schematic diagram of a prior art comparator.
Figure 2:
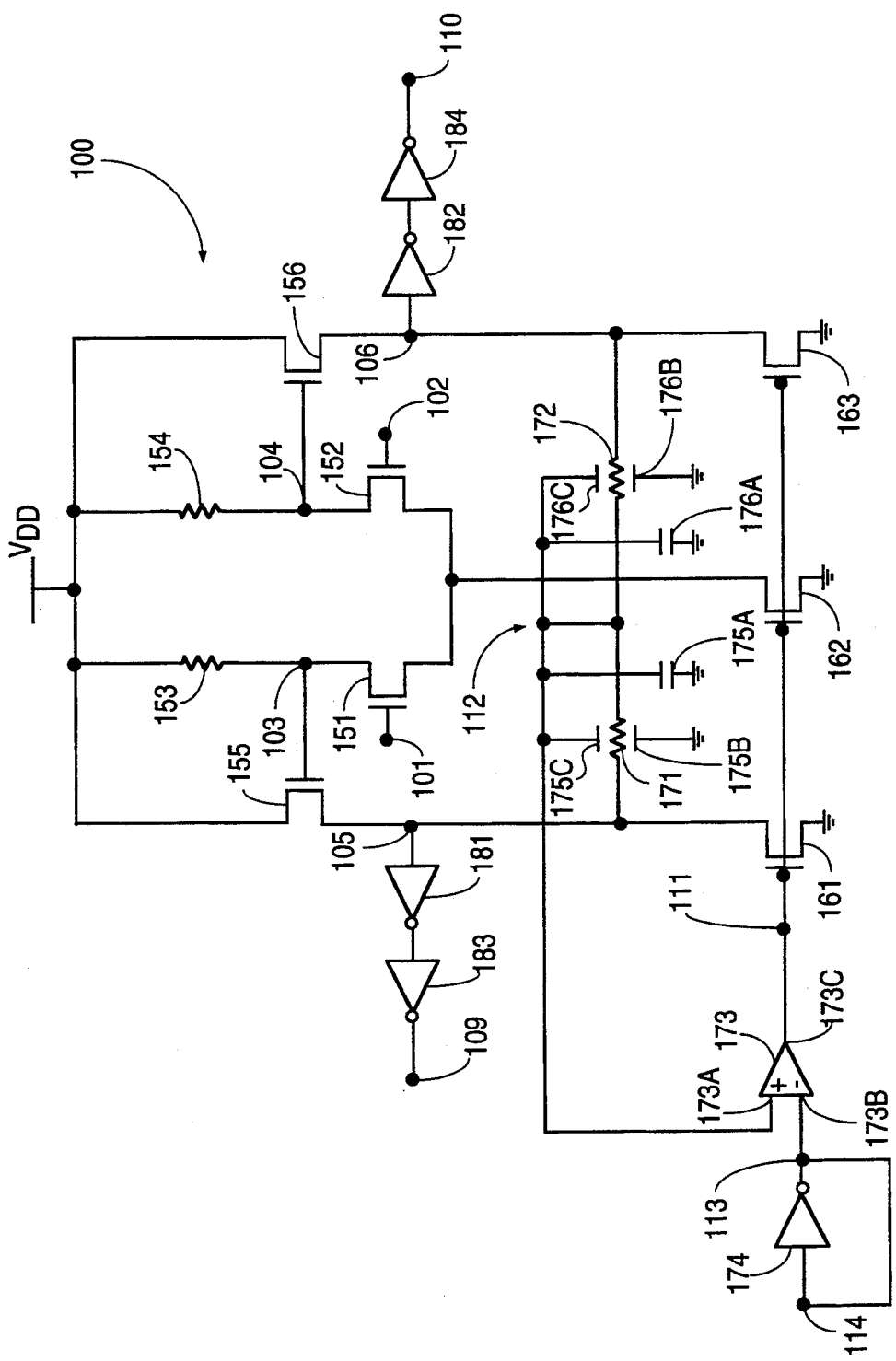
FIG. 2 is a circuit schematic diagram of a comparator.

FIG. 2 is a circuit schematic of comparator 100 according to an embodiment of the invention. Illustratively, the comparator 100 is electrically connected to a twisted pair data communications line (not shown). The voltage in the two lines of the twisted pair is applied to the comparator 100 at, respectively, node 101 and node 102. In a typical application, the differential voltage across node 101 and node 102 will be approximately sinusoidal with an amplitude range of from several hundred millivolts to several volts. The common-mode voltage of node 101 and node 102 may range from 2 volts to positive supply $V_{DD}$.

The two input voltages at nodes 101, 102 are first conditioned by a low gain first stage amplifier. In the first part of the low gain first stage amplifier, the two input voltages at nodes 101, 102 are amplified by a differential amplifier comprising transistor 151, transistor 152, resistors 153 and 154, and current sourcing transistor 162. The amplified voltages at nodes 103, 104 are then buffered by source followers comprising, respectively, transistor 155 and current sourcing transistor 161, and transistor 156 and current sourcing transistor 163. The voltages at nodes 105 and 106 are the buffered output of the low gain first stage.

The voltage at node 105 is amplified by inverting amplifiers 181 and 183, and output at node 109. In a similar manner, the voltage at node 106 is amplified by inverting amplifiers 182 and 184, and output at node 110. The voltages at nodes 109, 110 are the digital output voltages of the comparator 100.

Figure 3A:
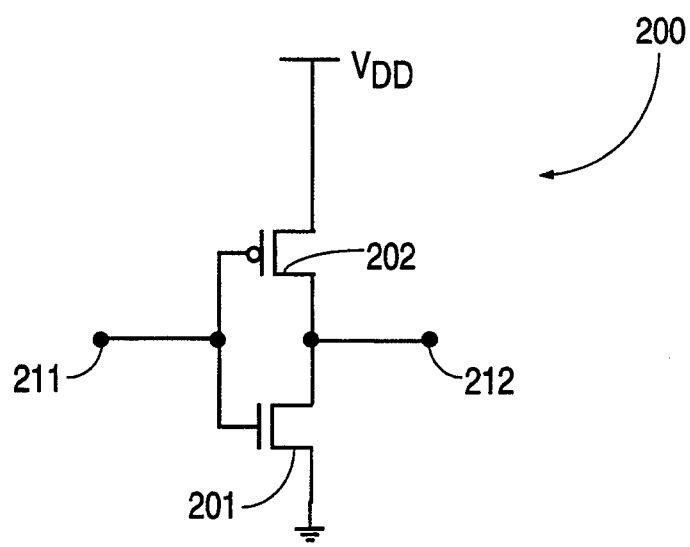
FIG. 3A is a circuit schematic diagram of an inverting amplifier.
Figure 3B:
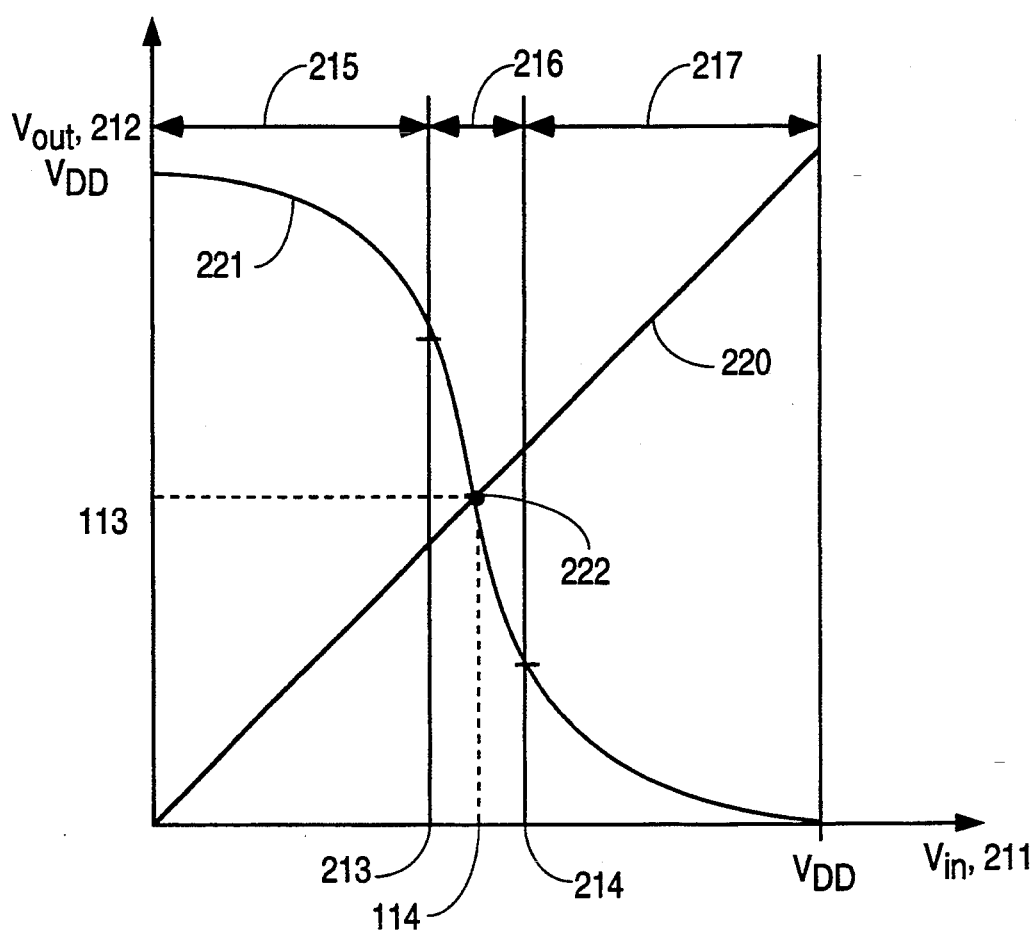
FIG. 3B is a graph of the input/output characteristic of the inverting amplifier of FIG. 3A.

FIG. 3A shows the structure of a typical inverting amplifier 200, the input/output characteristic 221 of which is shown in FIG. 3B. When the input voltage at node 211 to the inverting amplifier 200 is zero, the output voltage at node 212 is approximately equal to $V_{DD}$. As the input voltage at node 211 increases, the output voltage at node 212 begins to slowly decrease. This low gain region 215 exists while P-channel transistor 202 is in the triode region and N-channel transistor 201 is in the saturation region. As the input voltage at node 211 reaches voltage 213, P-channel transistor 202 also saturates, and the output voltage at node 212 begins to fall sharply with small increases in the input voltage at node 211. This high gain region 216 exists while both transistors 201 and 202 are in saturation. As the input voltage at node 211 reaches voltage 214, N-channel transistor 201 goes into the triode region while P-channel transistor 202 remains in saturation, and the inverting amplifier 200 enters the second low gain region 217. In this region, the output voltage at node 212 drops slowly to zero volts as the input voltage at node 211 increases to $V_{DD}$.

Referring again to FIG. 2, the inverting amplifiers 181, 182 are identical, and, by way of the bias voltage at node 111, the average of the voltages at node 105 and node 106 is centered about the high gain regions of the inverting amplifiers 181, 182. However, a bias offset arises in the comparator 100 due to, for example, temperature effects. The presence of bias offset means that the average value of the voltages at node 105 and node 106 may be outside the high gain region of the inverting amplifiers 181 and 182. Thus, the duty cycle of the comparator output waveform may not faithfully replicate the duty cycle of the waveform at the comparator input.

The comparator 100 minimizes the problem of bias offset through the implementation of feedback control circuitry. The voltages at node 105 and node 106 are applied to a resistive-captive network, which in an integrated circuit implementation is preferably distributed resistive-capacitive structures 171 and 172. The distributed resistive-capacitive structures 171 and 172 act as a voltage averager. The voltage at node 112 represents the average or common-mode voltage of the voltages at node 105 and node 106. The voltage at node 112 should ideally be equal to the voltage at the midpoint of the high gain region (logic threshold) of inverting amplifiers 181 and 182. However, as a bias offset voltage develops, the voltage at node 112 begins to deviate from the ideal value.

The voltage at node 112 is applied to the plus input 173A of an operational amplifier 173. The minus input 173B of the operational amplifier 173 is a reference voltage at node 113. The reference voltage at node 113 is obtained from inverting amplifier 174. The input and output of inverting amplifier 174 are shorted together so that the voltage at node 113 must equal the voltage at node 114 as shown by line 220 in FIG. 3B. Since the inverting amplifier 174 must also conform to the input/output characteristic 221, the inverting amplifier 174 must operate at point 222 (i.e., the middle of the high gain region 216). Thus, because inverting amplifier 174 is identical to inverting amplifiers 181 and 182, the reference voltage at node 113 is equal to the logic threshold of inverting amplifiers 181 and 182. The operational amplifier 173 compares the voltages at node 112 and node 113. Based upon this comparison, the voltage at node 111 is output at operational amplifier output 173C. The voltage at node 111 controls the transistors 161, 162, 163 which, in turn, control the current flow in the low gain first stage.

If the voltage at node 112 begins to drop below the voltage at node 113, the voltage at node 111 also begins to fall. Transistors 161, 162 and 163 respond by driving less current through the low gain first stage. The voltages at node 105 and node 106 rise. Consequently the voltage at node 112 (the average of the voltages at node 105 and node 106) rises back to its proper value. Conversely, if the voltage at node 112 begins to rise above the voltage at node 113, then the voltage at node 111 also begins to rise. Transistors 161, 162, and 163 respond by driving more current through the low gain first stage. The voltages at node 105 and node 106 drop, and the voltage at node 112 falls back to its proper value. Thus, the operational amplifier 173 and associated feedback circuitry provide negative feedback to keep the voltage at node 112 substantially equal to the logic threshold voltages of inverting amplifiers 181 and 182.

Figure 4:
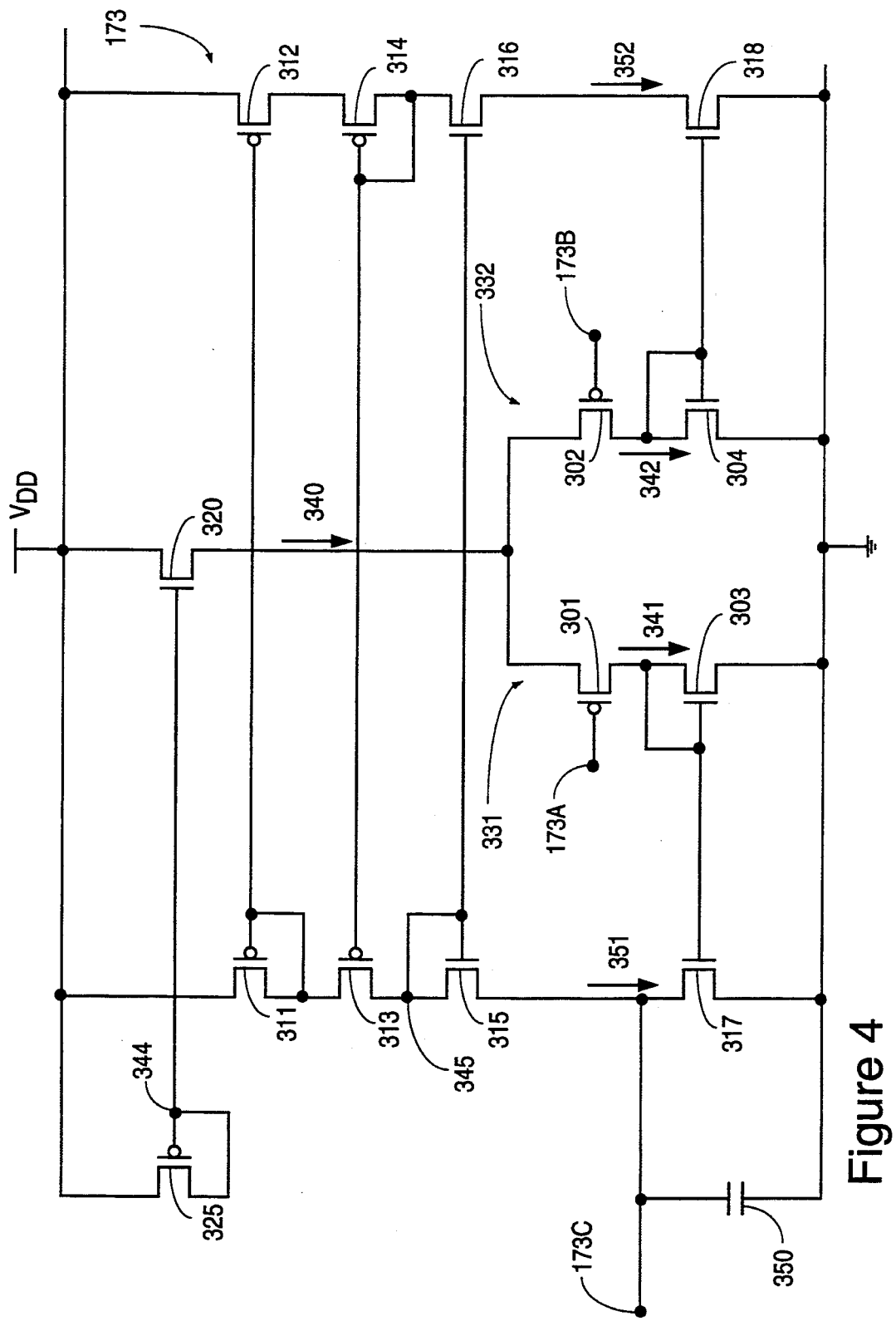
FIG. 4 is a circuit schematic diagram of an operational amplifier for use with the comparator of FIG. 2.

FIG. 4 shows a circuit schematic of the operational amplifier 173. Transistor 325 establishes a bias voltage at node 344. The bias voltage at node 344 controls transistor 320 to supply a constant current 340 through transistor 320. The current 340 is split between two branches: current 341 flows through branch 331 comprising transistors 301, 303 and current 342 flows through branch 332 comprising transistors 302, 304. The voltage inputs 173A and 173B to the operational amplifier 173 control how much current flows through each of the branches 331 and 332 since the current 340 is constant. Current 351, being mirrored by transistors 303 and 317, is equal to current 341. Current 352, being mirrored by transistors 304 and 318, is equal to current 342. Currents 351 and 352 go through cascode transistors 315 and 316, respectively. Transistors 311, 312, 313 and 314 serve as a differential to single-ended converter. The amplified version of the difference between input voltages 173A and 173B is available at node 345. The output voltage 173C is the level-shifted version of the voltage at node 345, and is more suitable than the voltage at node 345 for controlling the output voltage 173C (and thus, the voltage at node 111) because the output voltage 173C can swing to a lower voltage when transistors 161, 162 and 163 need to be shut off.

Figure 5A:
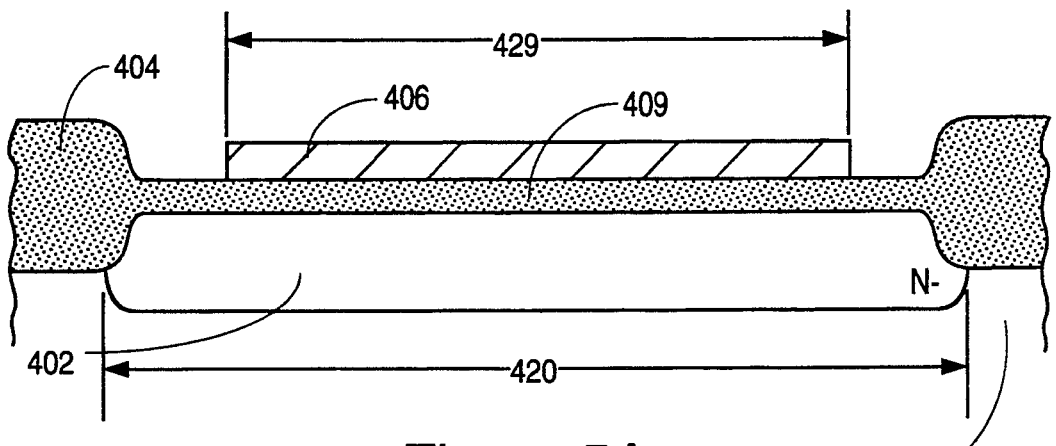
FIG. 5A is a cross-sectional view of a stage in the formation of an integrated circuit implementation of a distributed resistive-capacitive structure used in the comparator of FIG. 2.
Figure 5B:
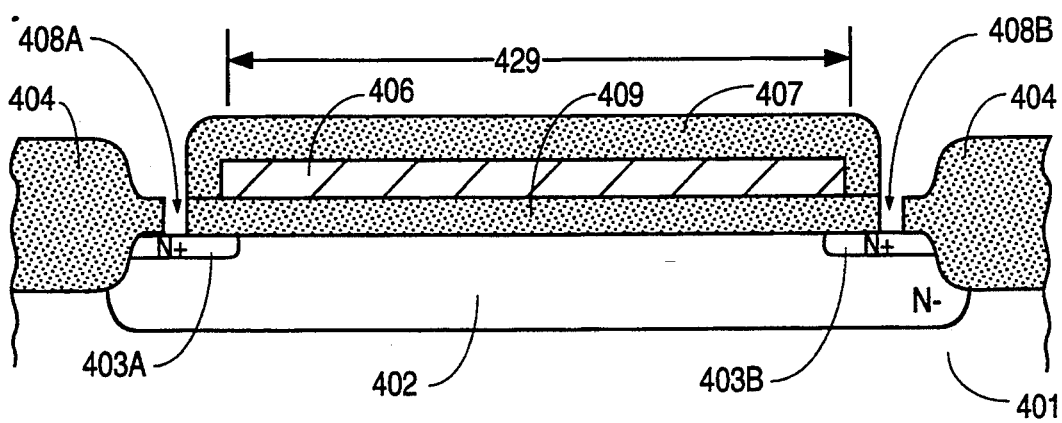
FIG. 5B is a cross-sectional view of a stage after the stage shown in FIG. 5A of an integrated circuit implementation of a distributed resistive-capacitive structure used in the comparator of FIG. 2.
Figure 5C:
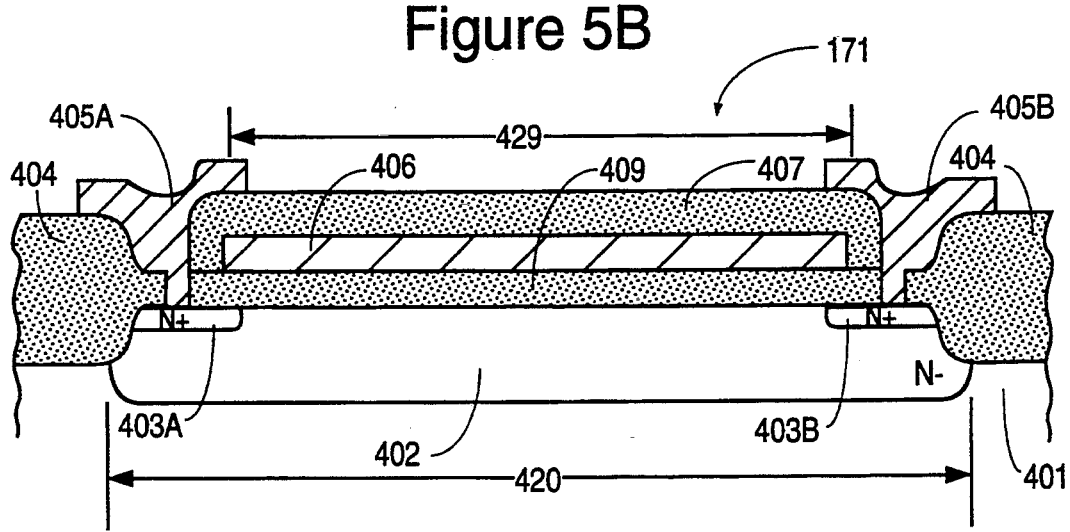
FIG. 5C is a cross-sectional view of an integrated circuit implementation of a distributed resistive-capacitive structure used in the comparator of FIG. 2.

FIG. 5C is a cross-sectional view of a representative portion of the distributed resistive-capacitive structure 171 and 172. FIGS. 5A or 5B are intermediate stages in the formation of the structure of FIG. 5C.

Referring to FIG. 5A, a first photolithographic operation defines the N− region 402 of length 420 in the P-type substrate 401. The N− region 402 may be doped by, for example, ion implantation followed by drive-in. After the N− region 402 is driven in, a thin layer of SiO$_2$ (not shown) is grown over the entire wafer. On top of the layer of SiO$_2$, a layer of Si$_3$N$_4$ (not shown) is deposited. A device-well mask is next used to etch the Si$_3$N$_4$ and SiO$_2$ layers outside the device-well areas. A field oxide layer 404 is grown in regions not covered by the Si$_3$N$_4$/SiO$_2$ mask. The use of Si$_3$N$_4$ as a mask for oxidation results in a semi-recessed device well structure. The Si$_3$N$_4$ is etched, exposing the thin SiO$_2$ layer. The exposed thin SiO$_2$ layer is removed and a new SiO$_2$ layer 409 is grown over the N− region 402. The SiO$_2$ layer 409 is the dielectric layer for the capacitors in this resistive-capacitive structure.

A polycrystalline silicon layer is deposited and a polysilicon mask is used to define the polysilicon plate 406 of length 429 for the resistive-capacitive structure, resulting in the structure of FIG. 5A. An illustrative concentration for the substrate 401 is $1 \times 10^{15}$ atoms/cm$^3$ and for the region 402 is $1 \times 10^{16}$ atoms/cm$^3$.

Referring to FIG. 5B, an exclusion mask is used to exclude regions (not shown) which must not receive the N+ implant. Regions which are outside the N+ exclusion area and which are not masked by thick oxide or polysilicon layers receive N+ implant. The N+ implant is driven in to form N+ regions 403A and 403B. The N+ regions 403A and 403B serve as contacts to the N− region 402 in this resistive-capacitive structure. The length of the capacitor defined by N− region 402 and polysilicon plate 406 is limited to the length 429 of the polysilicon plate 406 rather than the length 420 of the N− region 402. An illustrative concentration for the regions 403A and 403B is $9 \times 10^{18}$ atoms/cm$^3$.

A thick layer 407 of SiO$_2$ is deposited. FIG. 5B results after a contact mask is used to etch out the contact regions 408A and 408B.

In FIG. 5C, a layer of aluminum is evaporated over the entire surface. A metal mask is then used to define the metallization patterns 405A and 405B.

Figure 6:
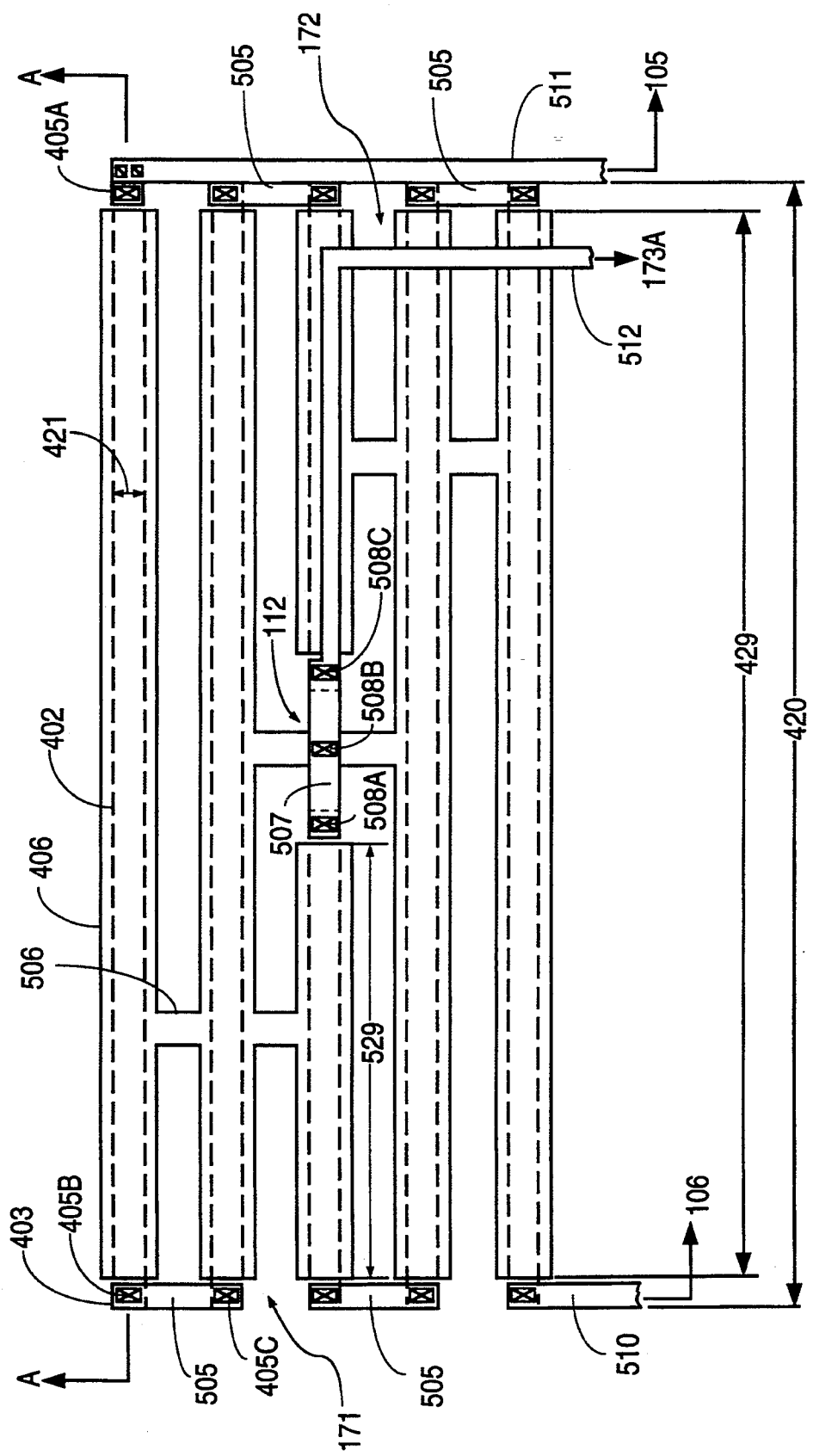
FIG. 6 is a top view of an integrated circuit implementation of a distributed resistive-capacitive structure used in the comparator of FIG. 2, with some layers omitted for clarity.

FIG. 6 is a top view of an integrated circuit implementation of the distributed resistive-capacitive structures 171 and 172. Each of the resistive-capacitive structures 171 and 172 is formed in a series of three strips; however, it is to be understood that one, two, four or more strips could also be used, depending on the resistance value desired and on layout considerations. The total length L of the lightly doped region 402 of each distributed resistive-capacitive structure 171 or 172 is equal to two times the length 429 plus the length 529. The width W of the lightly doped region 402 is equal to the width 421 of each of the strips.

The strips of a given resistive-capacitive structure 171 or 172 are electrically connected between metal contacts, e.g., metal contacts 405B, 405C, by metal strips 505. The polysilicon plates 406 of each strip are connected by polysilicon connecting regions 506.

The polysilicon plates 406 and the interior ends of the resistive lightly doped regions 402 of each distributed resistive-capacitive structure 171 and 172 are electrically connected at node 112 by metal strip 507 and metal contacts 508A, 508B, 508C. Metal strip 510 electrically connects the distributed resistive-capacitive structure 172 to node 106. Metal strip 511 electrically connects the distributive-capacitive structure 171 to node 105. Metal strip 512 electrically connects node 112 to the positive input 173A of operational amplifier 173.

For each distributed resistive-capacitive structure 171 or 172, suitable values of total resistance range from 50K to 200K. Suitable values of total capacitance range from 1.5 pF to 5 pF. If the sheet resistance (in ohms/□) is RHO and the gate oxide capacitance (in F/m$^2$) is CAP, then the total resistance, $R_{tot}$, and total capacitance, $C_{tot}$, of each distributed resistive-capacitive structure 171 or 172 is given by the following equations:

$R_{tot} = L/W * RHO$ $C_{tot} = L * W * CAP$

Illustratively, W is 5 micrometers and L is 384.5 micrometers. These dimensions yield nominal values of $R_{tot} = 100K$ and $C_{tot} = 2.65$ pF.

Each distributed resistive-capacitive structure 171 or 172 has a parasitic junction capacitance between the lightly doped N-type region 402 and the P-type substrate 401. Illustratively, the value of this capacitance is approximately 0.9 pF. This capacitance contributes to the capacitance in the distributed resistive-capacitance structure 171 and 172, as shown in FIG. 2 by the elements 175B and 176B, and should be considered in the design of the feedback circuitry.

Figure 5D:
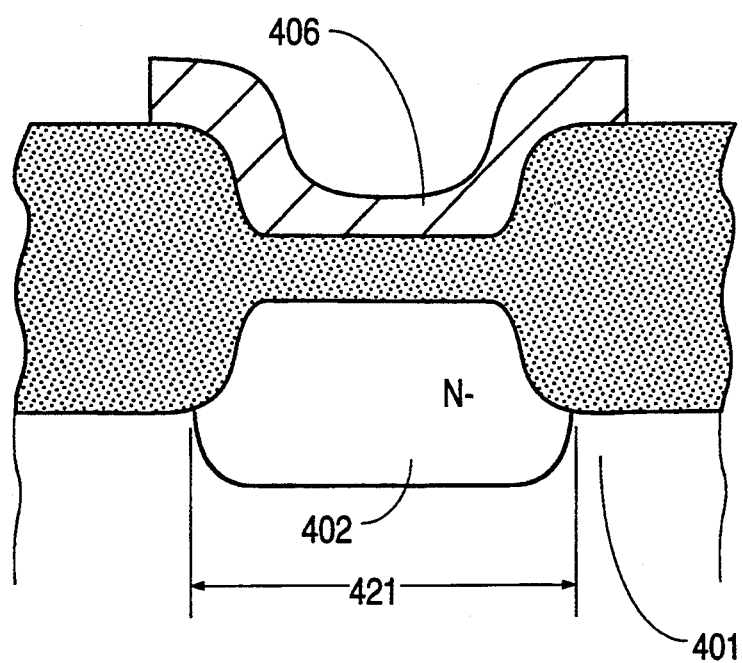
FIG. 5D is a cross-sectional view of an integrated circuit implementation of a distributed resistive-capacitive structure used in the comparator of FIG. 2 along a section perpendicular to the cross-sectional view shown in FIG. 5C.

Another pair of capacitances which should be considered in the design of the feedback circuitry are the capacitances 175A and 176A, shown in FIG. 2, which are formed between the polysilicon plate 406 and substrate 401 shown in FIG. 5D. These capacitances are minimized by using the minimum polysilicon plate 406 overlap of lightly doped region 402 allowed by the design rules. For the same reason, polysilicon connecting region 506, which is an extension of polysilicon plate 406, preferably is kept to the minimum width allowed by the design rules. The width and length (in micrometers) of the transistors in FIGS. 2 and 4 are set forth below in Table I.

TABLE I

| Transistor # | (Width:Length) | Transistor # | (Width:Length) |
|---|---|---|---|
| 151 | (500:1.5) | 301 | (150:2) |
| 152 | (500:1.5) | 302 | (150:2) |
| 155 | (100:2) | 303 | (50:3) |
| 156 | (100:2) | 304 | (50:3) |
| 161 | (50:3) | 311 | (200:4) |
| 162 | (100:3) | 312 | (200:4) |
| 163 | (50:3) | 313 | (200:1.5) |
| | | 314 | (200:1.5) |
| | | 315 | (100:1.5) |
| | | 316 | (100:1.5) |
| | | 317 | (50:3) |
| | | 318 | (50:3) |
| | | 320 | (200:6) |
| | | 325 | (100:6) |

Resistors 153 and 154 have a resistance of 2K and capacitor 350 has a capacitance of 5 pF.

Above, embodiments of the invention are described. The descriptions are intended to be illustrative, not limitative. Thus, modifications may be made to the invention as described without departing from the scope of the claims set out below.

What is claimed is:

1. A comparator for use with a data communications system, comprising:
    a first stage which accepts a differential voltage as comparator input, buffers the differential voltage, and produces first and second voltages;
    a voltage averaging network that averages the first and second voltages to produce a third voltage;
    feedback control circuitry which compares the third voltage to a reference voltage and produces a fourth voltage, wherein the fourth voltage controls the flow of current in the first stage such that the third voltage is maintained equal to the reference voltage; and
    a second stage which amplifies the first voltage and produces an output voltage as comparator output;
    wherein the reference voltage is equal to a voltage approximately centered within a high gain region of the second stage.

2. A comparator as in claim 1 wherein the voltage averaging network comprises a resistive-capacitive network having two mutually coupled sections with parallel resistive-capacitive elements, the two network sections respectively accepting the first and second voltages and furnishing the third voltage where mutually coupled.

3. A comparator for use with a data communications system, comprising:
    a low gain stage which accepts a differential voltage as comparator input, buffers the differential voltage, and produces first and second voltages;
    a resistive-capacitive voltage averaging network that averages the first and second voltages to produce a third voltage, wherein
        the resistance of the resistive capacitive network is provided by a lightly doped silicon region; and
        the capacitance of the resistive-capacitive network is provided by the lightly doped silicon region and a polysilicon region which are separated by an insulating region;
    feedback control circuitry which compares the third voltage to a reference voltage and produces a fourth voltage, wherein the fourth voltage controls the flow of current in the low gain stage such that the third voltage is maintained equal to the reference voltage; and
    a high gain stage which amplifies the first and second voltages voltage and produces an output voltage as comparator output.

4. A comparator for use with a data communications system, comprising:
    a low gain stage which accepts a differential voltage as comparator input, buffers the differential voltage, and produces first and second voltages;
    a voltage averaging network that averages the first and second voltages to produce a third voltage;
    feedback control circuitry which compares the third voltage to a reference voltage and produces a fourth voltage, wherein the fourth voltage controls the flow of current in the low gain stage such that the third voltage is maintained equal to the reference voltage; and
    a high grain stage which amplifies the first and second voltages and produces an output voltage as comparator output;
    wherein the high gain stage has a logic threshold voltage and the reference voltage equals the logic threshold voltage.

5. A comparator for data communications applications, comprising:
    a differential low gain amplifier stage with first and second data input terminals and first and second output terminals;
    a first output amplifier having an input terminal with a particular logic threshold connected to the first output terminal of said differential low gain amplifier stage;
    a resistive-capacitive network having first and second network input terminals respectively connected to the first and second output terminals of said differential low gain amplifier stage, said network being operative to provide an average of the voltages applied to said first and second network input terminals at a network output terminal;
    a voltage reference circuit having an output terminal for furnishing a voltage equal to the logic threshold of said first output amplifier; and
    an operational amplifier having a first input terminal connected to the output terminal of said voltage reference circuit, a second input terminal connected to said resistive-capacitive network output terminal, and an output terminal connected to said differential low gain amplifier stage so as to provide negative feedback thereto.

6. A comparator as in claim 5 wherein said resistive-capacitive network is a distributed network, comprising:
    a first lightly doped region diffused in a semiconductor substrate for providing a first resistance;
    a first conductive plate disposed over said first lightly doped region and insulated therefrom for providing a first capacitance;
    a second lightly doped region diffused in a semiconductor substrate for providing a second resistance; and
    a second conductive plate disposed over said first lightly doped region and insulated therefrom for providing a second capacitance;

wherein said first network input terminal comprises an end of said first lightly doped region, said second network input terminal comprises an end of said second lightly doped region, and said network output terminal comprises another end of said first lightly doped region, another end of said second lightly doped region, and portions of said first and said second conductive plates commonly connected.

7. A comparator for data communications applications, comprising:
  means for accepting a differential voltage;
  means for producing first and second voltages from the differential voltage;
  resistive-capacitive network means for averaging the first and second voltages to obtain a common-mode voltage, wherein the resistance of the resistive-capacitive network is provided by a lightly doped silicon region and the capacitance of the resistive-capacitive network is provided by the lightly doped silicon region and a polysilicon region which are separated by an insulating region;
  means for comparing the common-mode voltage to a reference voltage;
  means for adjusting the first and second voltages, based upon the comparison of the common-mode voltage to the reference voltage, so that the common-mode voltage equals the reference voltage; and
  means for producing an output voltage as a function of the first and second voltages.

8. A comparator as in claim 7 wherein the means for comparing and means for adjusting comprises an operational amplifier.

9. A comparator for use with a data communications system, comprising:
  a first amplifying stage which accepts a differential voltage as comparator input and produces first and second voltages;
  a resistive-capacitive voltage averaging network that averages the first and second voltages to produce a third voltage, the network having two mutually coupled sections with parallel resistive-capacitive elements, the two network sections respectively accepting the first and second voltages and furnishing the third voltage where mutually coupled; and
  feedback control circuitry which compares the third voltage to a reference voltage and produces a fourth voltage, wherein the fourth voltage controls the flow of current in the first amplifying stage such that the third voltage is maintained equal to the reference voltage.

10. A comparator as in claim 9, wherein the resistance of the resistive-capacitive network is between 50 and 200 kilo-ohms inclusive.

11. A comparator as in claim 10, wherein the capacitance of the resistive-capacitive network is between 1.5 and 5.0 kilo-ohms inclusive.

12. A comparator as in claim 9, wherein:
  the resistance of the resistive-capacitive network is provided by a lightly doped semiconductor region; and
  the capacitance of the resistive-capacitive network is provided by the lightly doped semiconductor region and a conductive region which are separated by an insulating region.

13. A comparator as in claim 12, wherein:
  the lightly doped semiconductor region further comprises a plurality of lightly doped semiconductor regions, each of the plurality of semiconductor regions connected to one or more of the other semiconductor regions by electrically conductive material; and
  the conductive region further comprises a plurality of conductive regions, each of the plurality of conductive regions connected to one or more of the other conductive regions by conductive connecting regions.

14. A comparator as in claim 13, wherein:
  each of the plurality of semiconductor regions has a length that is greater than the width, a lengthwise side of each of the semiconductor regions parallel and adjacent to a lengthwise side of one of the other semiconductor regions;
  each of the semiconductor regions being connected at an end or ends of the length to the other semiconductor region or regions;
  each of the plurality of conductive regions has a length that is greater than the width, a lengthwise side of each of the conductive regions parallel and adjacent to a lengthwise side of one of the other conductive regions; and
  each of the conductive regions being connected at an end or ends of the length to the other conductive region or regions.

15. A comparator as in claim 12, wherein:
  the lightly doped semiconductor region is a doped silicon region of a first conductivity type disposed in a body, the body being a doped silicon region of a second conductivity type that is opposite to the first conductivity type; and
  the capacitance of the resistive-capacitive network is primarily determined by capacitance between the lightly doped silicon region and the conductive region, and capacitance between the lightly doped silicon region and the body.

16. A comparator as in claim 15, wherein the conductive region is polysilicon.

17. A comparator as in claim 16, wherein:
  the insulating region comprises a thin oxide section disposed between a portion of the lightly doped silicon region and a portion of the polysilicon region, and a thick oxide section; and
  the capacitance between the lightly doped silicon region and the polysilicon region is controllable based on a thickness of the thin oxide section.

18. A comparator for use with a data communications system, comprising:
  a first amplifying stage which accepts a differential voltage as comparator input and produces first and second voltages;
  a voltage averaging network that averages the first and second voltages to produce a third voltage;
  feedback control circuitry which compares the third voltage to a reference voltage and produces a fourth voltage, wherein the fourth voltage controls the flow of current in the first amplifying stage such that the third voltage is maintained equal to the reference voltage; and
  a second amplifying stage which amplifies the first and second voltages and produces an output voltage as comparator output, the second amplifying stage having a logic threshold voltage that is equal to the reference voltage.

19. A integrated circuit data communications comparator comprising:

a first differential amplifier having first and second differential inputs, first and second differential outputs, and a bias voltage input;

a network comprising first and second network sections having parallel resistive-capacitive elements and essentially identical impedance, the first and second network sections being coupled to one another at one end to provide a network output, the first network section having another end coupled to the first differential output of the first differential amplifier, and the second network section having another end coupled to the second differential output of the first differential amplifier;

a reference voltage generator having an output; and a second differential amplifier having a first differential input coupled to the output of the network, a second differential input coupled to the output of the reference voltage generator, and an output coupled to the bias voltage input of the first differential amplifier.

20. A comparator as in claim 19 wherein the first differential amplifier comprises:

a low gain amplification stage having first and second differential outputs, the first and second differential inputs of the first differential amplifier being inputs of the low gain amplification stage, and the bias voltage input of the first differential amplifier being a bias voltage input of the low gain amplification stage;

a first buffer having an input coupled to the first differential output of the low gain amplification stage, an output, and a bias voltage input, the output of the first buffer being the first differential output of the first differential amplifier; and a second buffer having an input coupled to the second differential output of the low gain amplification stage, an output, and a bias voltage input, the output of the second buffer being the second differential output of the first differential amplifier;

wherein the output of the second differential amplifier is coupled to the bias voltage inputs of the first and second buffers.

21. A comparator as in claim 20 wherein the first and second buffers are source followers.

22. A comparator as in claim 19 further comprising an output amplifier having an input coupled to the first differential output of the first differential amplifier, and having an output, and being characterized by a high gain region; wherein the output of the network has a voltage substantially in the center of the high gain region of the output amplifier.

23. A comparator as in claim 22 wherein the reference voltage generator and the output amplifier comprise respective essentially identical amplifiers.

24. A comparator as in claim 19 further comprising:

a first output amplifier having an input coupled to the first differential output of the first differential amplifier, and having an output, and being characterized by a high gain region; and a second output amplifier having an input coupled to the second differential output of the first differential amplifier, and having an output, and being characterized by a high gain region;

wherein the output of the network has a voltage substantially in the center of the high gain regions of the first and second output amplifiers.

25. A comparator as in claim 24 wherein the reference voltage generator, the first output amplifier, and the second output amplifier comprise respective essentially identical amplifiers.

26. A comparator as in claim 19 wherein the first network section comprises:

a first lightly doped body region of the integrated circuit having a predetermined resistance;

a first dielectric region disposed over the first lightly doped body region; and a first conductive layer disposed over the first dielectric region and cooperatively providing with the first body region a predetermined capacitance;

and wherein the second network section comprises:

a second lightly doped body region of the integrated circuit having a resistance equal to the predetermined resistance;

a second dielectric region disposed over the second lightly doped body region; and a second conductive layer disposed over the second dielectric region and cooperatively providing with the second body region a capacitance equal to the predetermined capacitance.

27. A comparator as in claim 26 wherein the first and second body regions are essentially identical structures and are adjacent one another, and the first and second conductive layers are essentially identical structures.

* * * * *